United States Patent
Ryu (10) Patent No.: US 8,363,471 B2
(45) Date of Patent: Jan. 29, 2013

(54) NONVOLATILE MEMORY DEVICE AND METHOD OF PROGRAMMING THE SAME

(75) Inventor: Je Il Ryu, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 326 days.

(21) Appl. No.: 12/650,695

(22) Filed: Dec. 31, 2009

(65) Prior Publication Data

US 2010/0302851 A1    Dec. 2, 2010

(30) Foreign Application Priority Data

May 29, 2009    (KR) .................. 10-2009-0047815

(51) Int. Cl.
*G11C 11/34*    (2006.01)
(52) U.S. Cl. .............................. 365/185.14; 365/185.12
(58) Field of Classification Search .............. 365/185.12
See application file for complete search history.

(56) References Cited

U.S. PATENT DOCUMENTS

2009/0091981 A1*   4/2009   Park et al. ................ 365/185.12

FOREIGN PATENT DOCUMENTS

KR    1020080085539    9/2008

OTHER PUBLICATIONS

Notice of Allowance issued from Korean Intellectual Property Office on Nov. 30, 2010.

* cited by examiner

*Primary Examiner* — Anthan Tran
(74) *Attorney, Agent, or Firm* — IP & T Group LLP

(57) ABSTRACT

A nonvolatile memory device and a method of programming the device includes a memory cell array configured to have a number of memory cells, a row decoder coupled to the memory cells through word lines, page buffers coupled to the memory cells through bit lines, and a control unit configured to output correction voltages for reducing a difference in voltage between a selected one of the word lines and a channel region of a selected one of the memory cells in response to a program operation being performed.

19 Claims, 5 Drawing Sheets

NONVOLATILE MEMORY DEVICE AND METHOD OF PROGRAMMING THE SAME

CROSS-REFERENCE TO RELATED APPLICATIONS

Priority to Korean patent application number 10-2009-0047815 filed on May 29, 2009, the entire disclosure of which is incorporated by reference herein, is claimed.

BACKGROUND OF THE INVENTION

Embodiments of the present invention relate to a nonvolatile memory device and a method of programming the same.

In a nonvolatile memory device, a program operation is performed by supplying a ground voltage (e.g., 0 V) to a bit line coupled to a selected memory cell and a program voltage to a corresponding word line.

The states of the threshold voltages of single level cells (SLCs) are divided into an erase state and a program state. The states of the threshold voltages of multi-level cells (MLCs) include a number of periods. Accordingly, it is desirable to secure the margin between the threshold voltages. The reason for its desirability is described in more detail with reference to the drawings.

Figure 1:
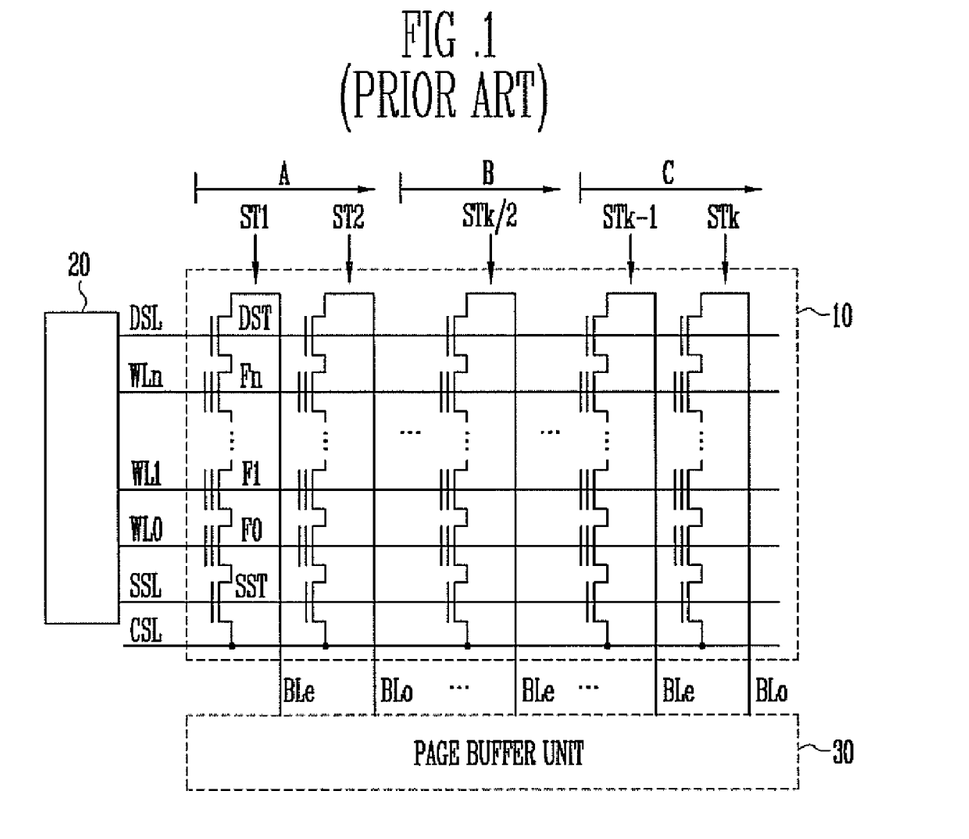
FIG. 1 is a circuit diagram of a conventional nonvolatile memory device.

FIG. 1 is a circuit diagram of a conventional nonvolatile memory device.

The nonvolatile memory device includes a memory cell array 10, a row decoder 20 configured to output a driving voltage to word lines WL0 to WLn, and a page buffer unit 30 configured to temporarily store data when a program operation, a verification operation, or a read operation is being performed.

The memory cell array 10 can include a number of memory blocks. Only one memory block is shown in FIG. 1, for convenience of description. The memory block includes a number of strings ST1 to STk. Each of the strings includes memory cells F0 to Fn coupled together in series, and a drain select transistor DST and a source select transistor SST respectively coupled to the ends of the memory cells F0 to Fn. The gate of the drain select transistor DST is coupled to a drain selection line DSL, and the gate of the source select transistor SST is coupled to a source selection line SSL. Furthermore, the gates of the memory cells F0 to Fn are respectively coupled to the word lines WL0 to WLn. The source of the source select transistor SST is electrically coupled to a common source line CSL. The drains of a pair of the drain select transistors DST are coupled to respective bit lines BLe and BLo.

The row decoder 20 is configured to output a driving voltage to the drain selection line DSL, the source selection line SSL, and the word lines WL0 to WLn.

The page buffer unit 30 includes a number of page buffers. Each of the page buffers can be coupled to an even bit line BLe and an odd bit line BLo, or two page buffers can be coupled to the even and odd bit lines BLe and BLo, respectively.

An operation of programming the nonvolatile memory device is briefly described below.

To perform the program operation, a power source voltage is supplied to a bit line coupled to an unselected string (i.e., a string not including memory cells to be programmed), a ground voltage (e.g., 0 V) is supplied to a bit line coupled to a selected string (i.e., a string including memory cells to be programmed), a pass voltage is supplied to an unselected word line, and a program voltage is supplied to a selected word line.

In particular, a voltage supplied to the word lines WL0 to WLn is output from the row decoder 20. Thus, the program voltage is supplied later to a string far away from the row decoder 20 than to a string close to the row decoder 20 because of a delay time. That is, in FIG. 1, the program voltage is supplied later to the strings of a region B than to the strings of a region A. Furthermore, the program voltage is supplied later to the strings of a region C than to the strings of the region B. The reason is described in more detail below with reference to FIG. 2.

Figure 2:
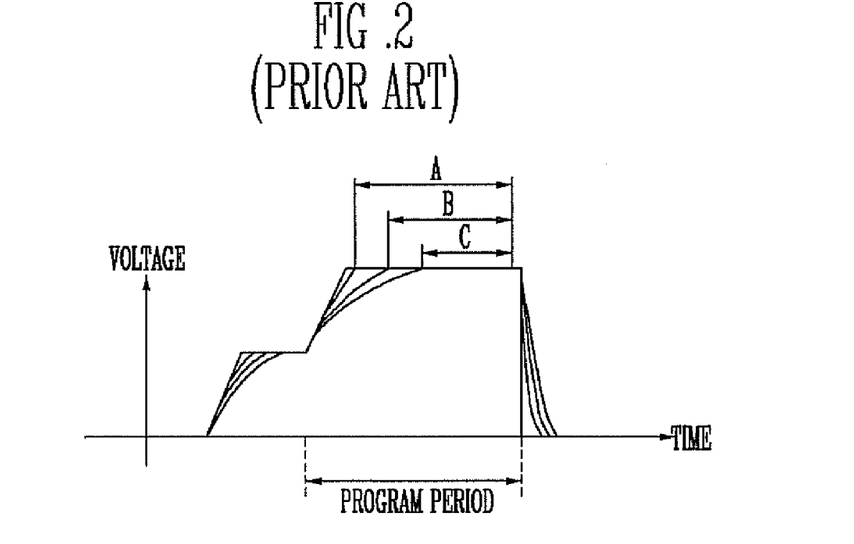
FIG. 2 is a graph showing a conventional program period.

FIG. 2 is a graph showing a conventional program period.

A program voltage is output from the row decoder 20. Thus, the time during which the program voltage is supplied to memory cells close to the row decoder 20 is long (refer to A of FIG. 2), and the time during which the program voltage is supplied to memory cells far away from the row decoder 20 is short (refer to C of FIG. 2). Such a phenomenon is caused by the time that the program voltage takes to reach corresponding memory cells from the row decoder 20 (i.e., a delay time). The time when the program voltage is supplied to a selected word line is the same, but the time that the program voltage takes to reach each memory cell coupled to the selected word line differs depending on the distance therebetween. Accordingly, the time when each memory cell is programmed also differs. Consequently, the threshold voltages of the memory cells can differ.

Figure 3:
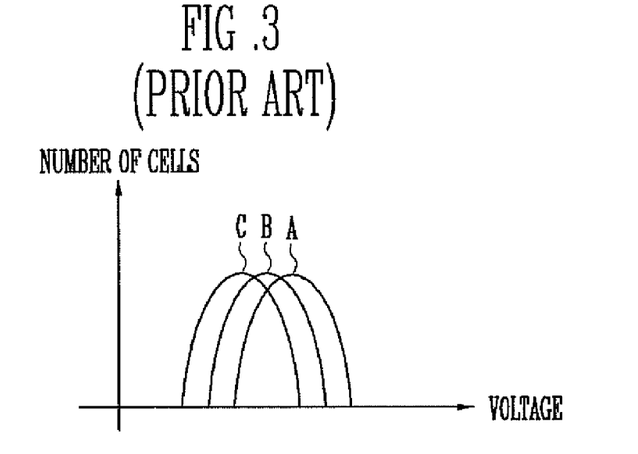
FIG. 3 is a graph showing conventional distributions of threshold voltages.

FIG. 3 is a graph showing conventional distributions of threshold voltages.

Although memory cells are supplied with program voltages having the same level, they can have different threshold voltages because of a difference in the time period during which the program voltage is being supplied. In FIG. 3, a graph C shows a distribution of the threshold voltages of the memory cells coupled to the strings belonging to the region C shown in FIG. 1. A graph B shows a distribution of the threshold voltages of the memory cells coupled to the strings belonging to the region B shown in FIG. 1. A graph A shows a distribution of the threshold voltages of the memory cells coupled to the strings belonging to the region A shown in FIG. 1. That is, a distribution of the threshold voltages of memory cells coupled to strings far away from the row decoder 20 (refer to FIG. 1) can be lower than a distribution of the threshold voltages of memory cells coupled to strings close to the row decoder 20 (refer to FIG. 1).

In this case, if the memory cells have different threshold voltages, although the same program operation is performed on the memory cells, the reliability of a nonvolatile memory device can be deteriorated.

SUMMARY OF THE INVENTION

According to embodiments of the present invention, when a program operation is performed, the level of voltage supplied to a bit line is adjusted according to the distance from a row decoder. Accordingly, the time period during which a program voltage is supplied to each memory cell is equalized.

A nonvolatile memory device according to an embodiment of the present invention includes a memory cell array having a number of memory cells, a row decoder coupled to the memory cells through word lines, page buffers coupled to the memory cells through bit lines, and a control unit configured to generate correction voltages for reducing a difference in voltage between a selected one of the word lines and a channel region of a selected one of the memory cells in response to a program operation being performed.

A nonvolatile memory device according to another embodiment of the present invention includes a memory cell array having a number of memory cells, a row decoder coupled to the memory cells through word lines, page buffers coupled to the memory cells through bit lines, and a control unit configured to sequentially supply correction voltages to the bit lines in order of the bit lines' closeness to the row decoder.

The control unit includes a number of correction voltage generators configured to generate the respective correction voltages, and a number of data control units configured to input data to the page buffers.

When a level of the correction voltage shifts from a high level to a low level, a corresponding correction voltage generator generates and outputs an operation signal to a corresponding data control unit. The corresponding data control unit outputs first and second input signals for storing the data in a corresponding page buffer in response to the operation signal.

When the program operation is being performed, the data control unit outputs the first and second input signals to the page buffer and also outputs the first and second input signals to the corresponding page buffer in response to the operation signal output by the corresponding correction voltage generator.

Each of the correction voltages is either supplied to a node between a sense node and a bit line selection unit of each of the page buffers, or is supplied to a corresponding bit line, A method of programming a nonvolatile memory device according to yet another embodiment of the present invention includes selecting a memory block including memory cells, a row decoder supplying a pass voltage to word lines coupled to the memory cells, supplying a program voltage to a selected word line coupled to selected ones of the memory cells, and sequentially supplying correction voltages to all of the bit lines coupled to the selected memory cells, in order of the bit lines' closeness to the row decoder, to equalize the time to supply the program voltage to each of the selected memory cells.

A method of programming a nonvolatile memory device according to a further embodiment of the present invention includes selecting a memory block having memory cells, a row decoder supplying a pass voltage to word lines coupled to the memory cells, supplying a program voltage to a selected word line from among the word lines coupled to selected ones of the memory cells, and sequentially supplying correction voltages to only bit lines coupled to the selected memory cells, in order of the bit lines' closeness to the row decoder, to equalize the time period to supply the program voltage to each of the selected memory cells.

Correction voltages having a high level are supplied to the bit lines.

Before the correction voltages are supplied to the bit lines, a voltage of a high level is supplied to a drain select line to electrically couple channels of selected strings.

The bit lines are classified into groups, and the correction voltages are generated on a group basis. Groups selected from the groups generate the correction voltages at the same time.

The correction voltages are later supplied to bit lines far away from the row decoder than to bit lines close to the row decoder. The time period to supply the correction voltage to the bit line corresponds to the time period to supply the program voltage to the memory cells.

The correction voltages are sequentially supplied to all of the bit lines coupled to the memory cells and the program voltage is supplied to selected memory cells during a set time period.

When a semiconductor device is tested, the correction voltage is determined by measuring a difference between the time period to supply the program voltage to memory cells closest to the row decoder and the time period to supply the program voltage to memory cells farthest from the row decoder and dividing the measured difference by the number of memory cells included in a page.

DESCRIPTION OF INVENTION

Hereinafter, embodiments of the present invention are described in detail with reference to the accompanying drawings. The drawing figures are provided to allow those having ordinary skill in the art to understand the scope of the embodiments of the present invention.

Figure 4:
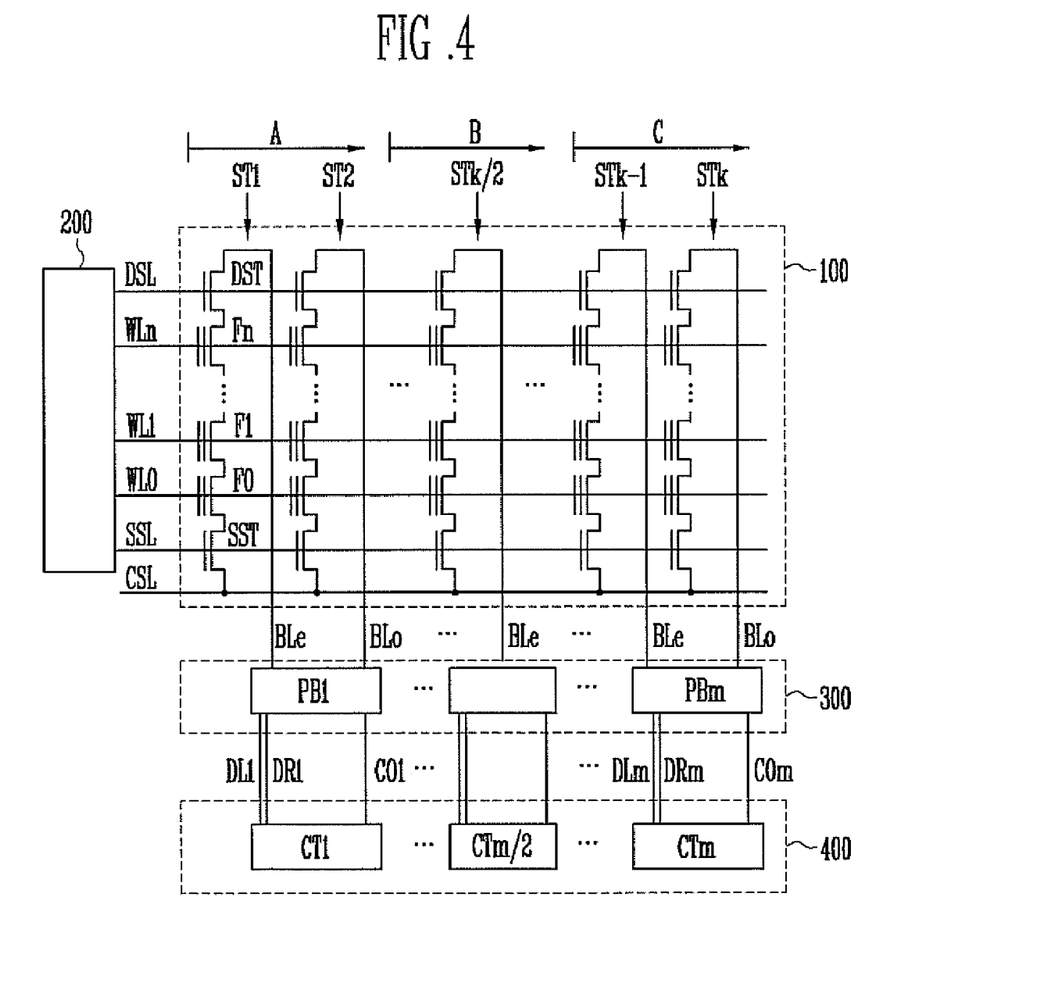
FIG. 4 is a circuit diagram of a nonvolatile memory device according to an embodiment of the present invention.

FIG. 4 is a circuit diagram of a nonvolatile memory device according to an embodiment of the present invention. In particular, this drawing figure is a circuit diagram showing the case in which correction voltages are supplied to a page buffer unit.

Referring to FIG. 4, the nonvolatile memory device includes a memory cell array 100, a row decoder 200, a page buffer unit 300, and a control unit 400.

The memory cell array 100 includes a number of memory blocks. Only one memory block is shown in FIG. 4 for convenience of description. The memory block includes a number of strings ST1 to STk. Each of the strings includes memory cells F0 to Fn coupled together in series. A drain select transistor DST and a source select transistor SST are coupled to respective end terminals of the memory cells F0 to Fn. The gate of the drain select transistor DST is coupled to a drain selection line DSL, and the gate of the source select transistor SST is coupled to a source selection line SSL. Furthermore, the gates of the memory cells F0 to Fn are coupled to respective word lines WL0 to WLn. The source of the source select transistor SST is coupled to a common source line CSL, and the drains of a pair of the drain select transistors DST are coupled to respective bit lines BLe and BLo.

The row decoder 200 is configured to supply a driving voltage (e.g., a pass voltage or a program voltage) to the drain selection line DSL, the source selection line SSL, and the word lines WL0 to WLn.

The page buffer unit 300 includes a number of page buffers PB1 to PBm. Each of the page buffers is coupled to the even and odd bit lines BLe and BLo. Thus, the number of page buffers is ½ the number of bit lines BLe and BLo.

The control unit 400 includes a number of control circuits CT1 to CTm. The control circuits CT1 to CTm are coupled to the respective page buffers of the page buffer unit 200 and are configured to supply respective correction voltages CO1 to Com, respective first input signals DL1 to DLm, and respective second input signals DR1 to DRm to the respective page buffers. The correction voltages CO1 to Com can be used to control the time period during which a program voltage is supplied to a selected memory cell by changing the voltage level of the bit lines BLe and BLo when a program operation is being performed. The first and second input signals DL1 to DLm and DR1 to DRm are outputted in response to data to be stored in the selected memory cell. Furthermore, the control circuits CT1 to CTm may be grouped into two or more circuits and can be operated on a group basis.

Figure 5:
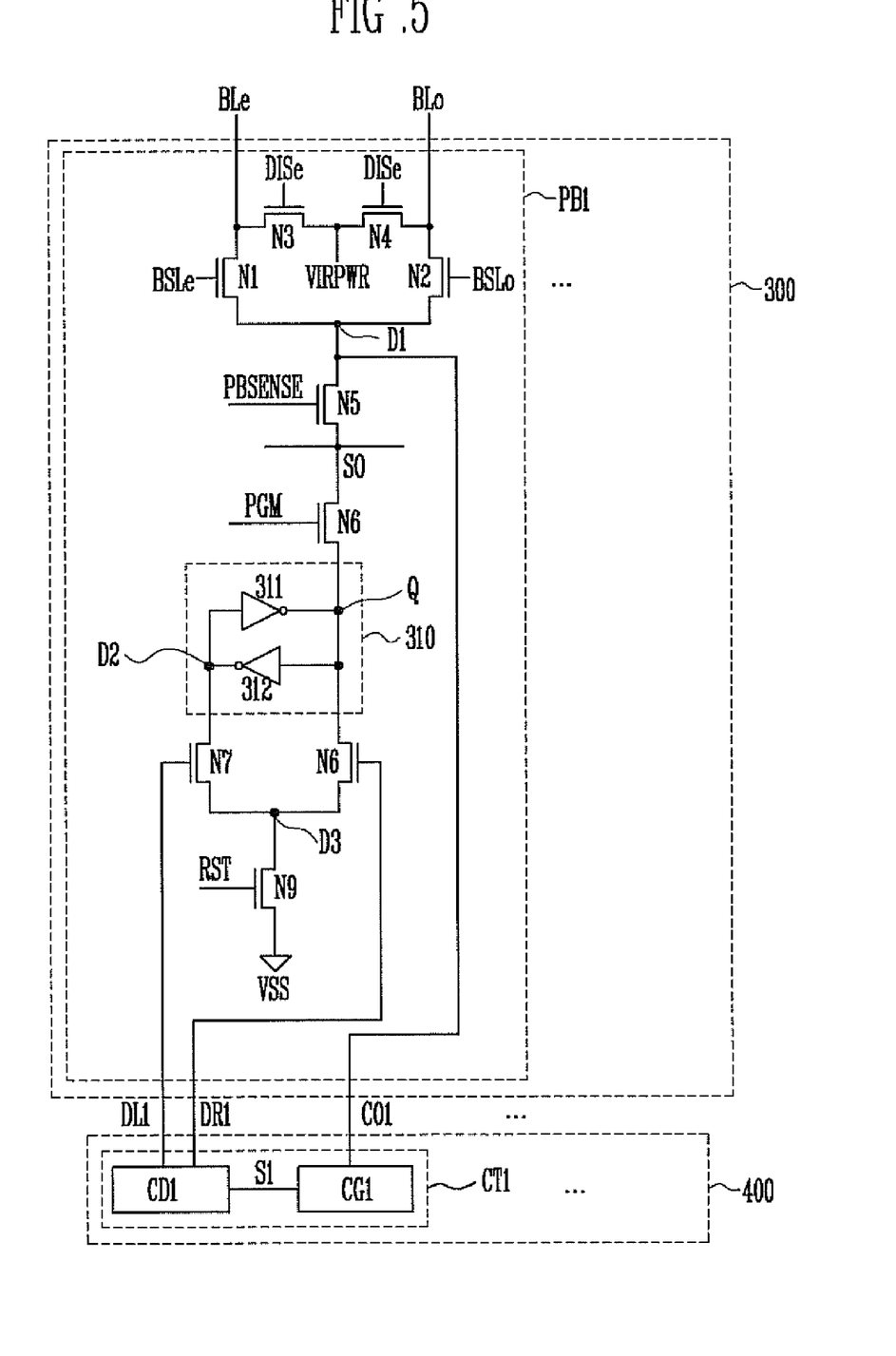
FIG. 5 is a diagram illustrating part of a page buffer and a control unit according to another embodiment of the present invention.

FIG. 5 is a diagram illustrating part of the page buffer and the control unit according to an embodiment of the present invention.

The page buffer unit 300 includes a number of page buffers PB1 to PBm. The control unit 400 includes a number of control circuits CT1 to CTm. One page buffer PB1 and one control circuit CT1 are interconnected and are configured to output the correction voltage CO1 and the first and second input signals DL1 and DR1. Furthermore, the page buffer PB1 is coupled to the memory cell array via the even and odd bit lines BLe and BLo.

FIG. 5 shows only part of the page buffer PB1. The page buffer PB1 includes first to ninth switch elements N1 to N9. The first switch element N1 is coupled between the even bit line BLe and a first node D1 and is operated in response to an even bit line selection signal BSLe. The second switch element N2 is coupled between the odd bit line BLo and the first node D1 and is operated in response to an odd bit line selection signal BSLo. The third and fourth switch elements N3 and N4 are coupled in series between the even and odd bit lines BLe and BLo. A node between the third and fourth switch elements N3 and N4 is supplied with a virtual voltage VIRPWR. The third switch element N3 is operated in response to an even virtual signal DISe, and the fourth switch element N4 is operated in response to an odd virtual signal DISo. In particular, the correction voltage CO1 is supplied to the first node D1. As described above, a circuit unit in which the first to fourth switch elements N1 to N4 are interconnected is also called a bit line selection unit.

The fifth switch element N5 is coupled between the first node D1 and a sense node SO and is operated in response to a sense signal PBSENSE. The sixth switch element N6 is coupled between the sense node SO and a latch 310 and is operated in response to a program signal PGM. The latch 310 includes inverters 311 and 312 coupled between a data node Q and a second node D2. The seventh switch element N7 is coupled between the second node D2 and a third node N3 and is operated in response to the first input signal DL1. The eighth switch element N8 is coupled between the data node Q and the third node N3 and is operated in response to the second input signal DR1. The ninth switch element N9 is coupled between the third node D3 and a node from which a ground voltage Vss is supplied and is operated in response to a reset signal RST. The first to ninth switch elements N1 to N9 can be implemented using NMOS transistors.

The control circuit CT1 includes a data control unit CD1 configured to output the first and second input signals DL1 and DR1 and a correction voltage generator CG1 configured to generate the correction voltage CO1. The correction voltage CO1 is supplied to the first node D1 of the page buffer PB1, thus changing the voltage level supplied to the selected bit line BLe or BLo. Furthermore, the correction voltage generator CG1 supplies an operation signal S1 to the data control unit CD1. The data control unit CD1 outputs the first and second input signals DL1 and DR1 in response to the operation signal S1.

Figure 6:
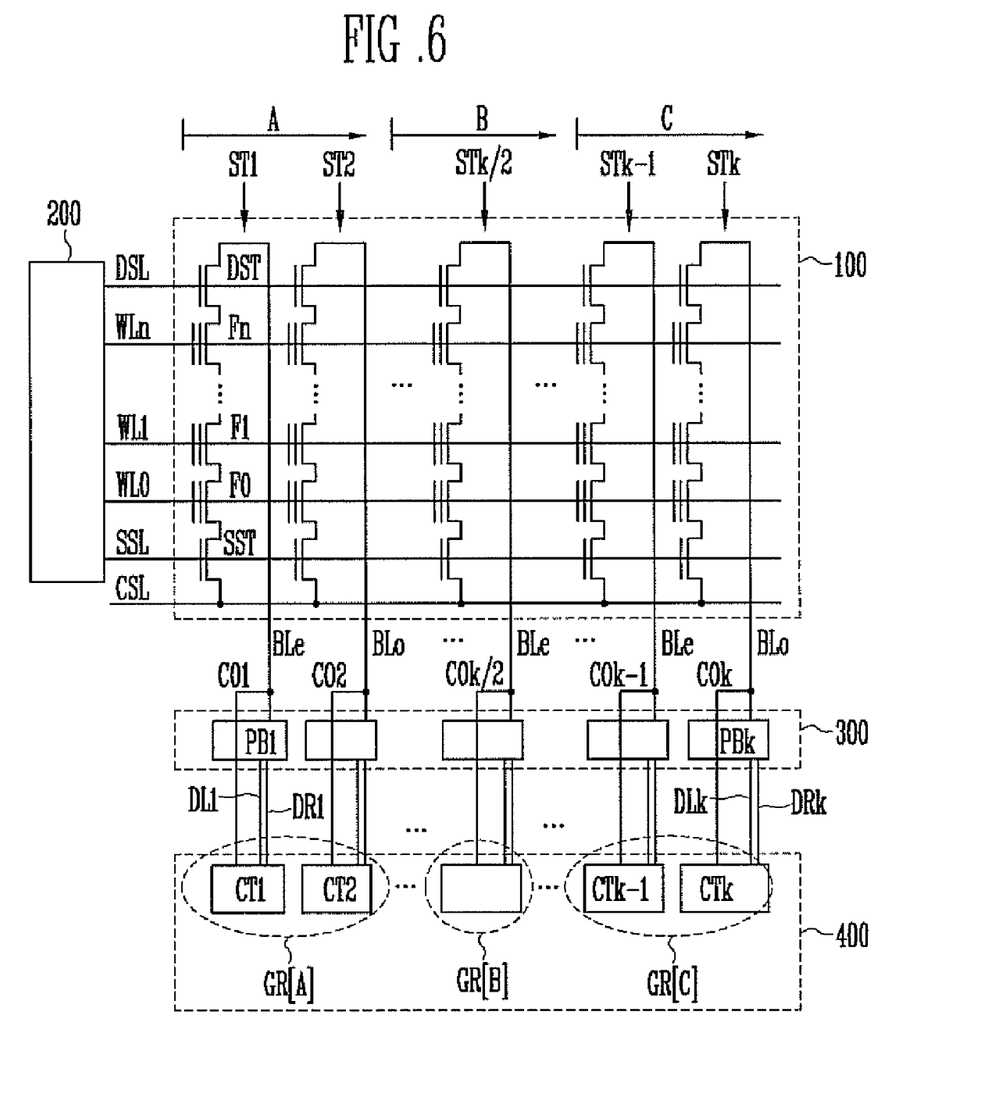
FIG. 6 is a circuit diagram of a nonvolatile memory device according to still another embodiment of the present invention.

FIG. 6 is a circuit diagram of a nonvolatile memory device according to another embodiment of the present invention. In particular, FIG. 6 is a circuit diagram showing an example in which correction voltages are directly supplied to even or odd bit lines.

A memory cell array 100 includes a number of memory blocks. Only one memory block is shown in FIG. 6 for convenience of description. The memory block includes a number of strings ST1 to STk. Each of the strings includes memory cells F0 to Fn coupled together in series. A drain select transistor DST and a source select transistor SST are coupled to respective end terminals of the memory cells F0 to Fn. The gate of the drain select transistor DST is coupled to a drain selection line DSL, and the gate of the source select transistor SST is coupled to a source selection line SSL. Furthermore, the gates of the memory cells F0 to Fn are coupled to respective word lines WL0 to WLn. The source of the source select transistor SST is coupled to a common source line CSL, and the drains of a pair of the drain select transistors DST are coupled to respective bit lines BLe and BLo.

The row decoder 200 is configured to supply a driving voltage (e.g., a pass voltage or a program voltage) to the drain selection line DSL, the source selection line SSL, and the word lines WL0 to WLn.

The page buffer unit 300 includes a number of page buffers PB1 to PBk. Each of the page buffers is coupled to the memory cell array 100 via the even or odd bit line BLe or BLo. Accordingly, the number of page buffers PB1 to PBk is equal to the number of bit lines BLe and BLo.

The control unit 400 includes a number of control circuits CT1 to CTk. The control circuits CT1 to CTk are configured to output respective correction voltages CO1 to COk, respective first input signals DL1 to DLk, and respective second input signals DR1 to DRk. Each of the correction voltages CO1 to COk is supplied to each of the bit lines BLe and BLo, and the first and second input signals DL1 to DLk and DR1 to DRk are supplied to the page buffer unit 300. When a program operation of an increasing step pulse program (ISPP) method is performed, the control circuits CT1 to CTk supply the first and second input signals DL1 to DLk and DR1 to DRk to the page buffer unit 300 in response to data. In particular, when a program operation is performed, the control circuits CT1 to CTk output the correction voltages CO1 to COk of a high level. When the level of voltage supplied to the bit lines BLe and BLo is changed in response to the correction voltages CO1 to COk of a high level, data stored in the latches of the page buffers PB1 to PBk can be changed. Accordingly, when the level of the correction voltages CO1 to COk changes from a high level to a low level, the control unit 400 again outputs the first and second input signals DL1 to DLk and DR1 to DRk and stores data in the latches of the page buffers PB1 to PBk.

Furthermore, the control circuits CT1 to CTk of the control unit 400 may be grouped into two or more circuits and configured to output the correction voltages CO1 to COk during the same time period on a group basis. For example, in the case in which the control circuits CT1 to CTk are classified into three groups GR[A], GR[B], and GR[C], the correction voltage generation groups GR[A], GR[B], and GR[C] can generate the correction voltages during the same time period on a group basis.

A program operation according to an embodiment of the present invention is described in more detail below.

Figure 7:
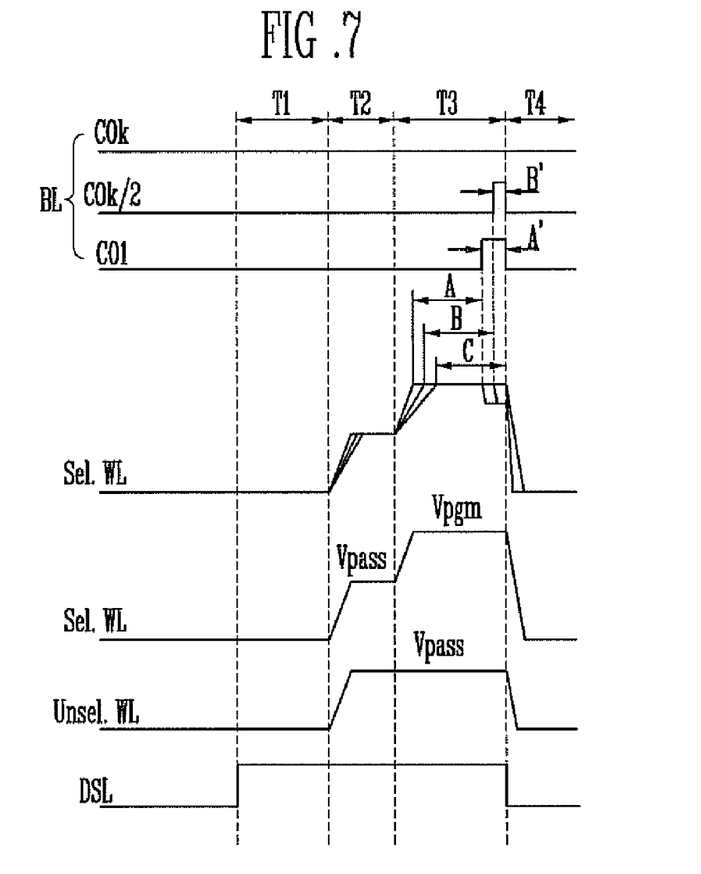
FIG. 7 is a timing diagram illustrating a program operation according to yet another embodiment of the present invention.

FIG. 7 is a timing diagram illustrating the program operation according to an embodiment of the present invention.

The program operation includes a program preparation time period T1, a pass voltage application time period T2, a program voltage application time period T3, and a program completion time period T4. In the program completion time period T4, a program verification operation (not shown) is performed. Each of the time periods is described in more detail below.

In the program preparation time period T1, the data control unit CD1 (refer to FIG. 5) outputs the first and second input signals DL1 and DR1, and data are stored in the latch 310 (refer to FIG. 5). In more detail, in order to have a value '0' or '1' according to a selected bit line or unselected bit lines, data to be stored in the latch 310 (refer to FIG. 5) are supplied with a low or high level to the node Q. Next, to precharge the unselected bit lines, a voltage of a high level is supplied to the drain selection line DSL to turn on the drain select transistor DST.

In the pass voltage application time period T2, in the state in which the voltage of a high level has been supplied to the drain selection line DSL (refer to FIG. 6), a pass voltage Vpass is supplied to a selected word line Sel. WL (word line coupled to a memory cell to be programmed) and unselected word lines Unsel. WL (word lines not coupled to the memory cell to be programmed). That is, the pass voltage Vpass is supplied to all of the word lines WL0 to WLn (refer to FIG. 6). The pass voltage Vpass is supplied to the word lines WL0 to WLn via the row decoder 200 (refer to FIG. 6). The pass voltage Vpass is supplied later to strings far away from the row decoder 200 (refer to FIG. 6) than to strings close to the row decoder 200 (refer to FIG. 6) because of the resistance components of the word lines. In other words, points of time at which the pass voltage Vpass rises differ in both the strings. That is, the time period that the pass voltage Vpass takes to reach the strings far away from the row decoder can be longer than the time that the pass voltage Vpass takes to reach the strings close to the row decoder. In more detail, the time period that the pass voltage Vpass takes to reach the memory cells coupled to the $k^{th}$ string STk (refer to FIG. 6) can be longer than the time period that the pass voltage Vpass takes to reach the memory cells coupled to the $1^{st}$ string ST1 (refer to FIG. 6) because the distance between the $k^{th}$ string and the row decoder 200 (refer to FIG. 6) is greater than the distance between the $1^{st}$ string and the row decoder 200 (refer to FIG. 6).

In the program voltage application period T3, a program voltage Vpgm is supplied to the selected word line Sel. WL to which the pass voltage Vpass has been supplied. At this time, the pass voltage Vpass continues to be supplied to the remaining unselected word lines Unsel. WL. The program voltage Vpgm is also supplied via the row decoder 200 (refer to FIG. 6).

In particular, the time period needed to supply the program voltage Vpgm to the memory cells close to the row decoder 200 (refer to FIG. 6) is short, and the time period needed to supply the program voltage Vpgm to memory cells far away from the row decoder 200 (refer to FIG. 6) is long. Such a phenomenon is generated by a delay time resulting from the resistance of the word lines WL. The time period needed to supply the program voltage Vpgm to the memory cells differs depending on the distance between the memory cells and the row decoder 200 (refer to FIG. 6) because of the delay time. In other words, the time delay needed to supply the program voltage Vpgm to the memory cells far away from the row decoder is longer than the time that it takes to supply the program voltage Vpgm to the memory cells close to the row decoder 200 (refer to FIG. 6) because of the resistance components of the word lines.

To prevent such a phenomenon, the level of voltage supplied to a bit line is corrected with consideration taken of the delay time of the program voltage Vpgm such that the program voltage Vpgm is supplied to memory cells Sel. Cell coupled to the selected word line Sel. WL at the same time.

In more detail, when a program operation is performed, a ground voltage (e.g., 0 V) is supplied to a selected bit line. If the level of the voltage supplied to the selected bit line is raised, a difference in the voltage between a channel region and a word line, coupled to memory cells coupled to the selected bit line, is reduced. Accordingly, electrons are not introduced into the selected memory cells, thereby stopping the program operation. As described above, if the level of voltage supplied to a selected bit line is raised during a program operation, the time period during which the program operation is performed can be controlled. A detailed method is described below.

The program voltage Vpgm is supplied to the selected word line Sel. WL. After a passage of a set time period that the memory cells coupled to the selected word line Sel. WL can be programmed, the first correction voltage CO1 (refer to FIG. 6) is supplied to a bit line (e.g., the even bit line BLe) coupled to the string ST1 (refer to FIG. 6) which is the closest to the row decoder 200 (refer to FIG. 6). The first correction voltage CO1 is preferably supplied at a high level. In this case, the time period (refer to C of FIG. 6) that it takes to program memory cells which are the farthest away from the row decoder 200 (refer to FIG. 6) is a base.

In particular, the correction voltage generators CT1 to CTk sequentially output the correction voltages CO1 to COk in order of the distance from the row decoder 200 (refer to FIG. 6). The time interval between the correction voltages CO1 to COk supplied to neighboring bit lines is preferably identical to the time interval that the program voltage Vpgm takes to reach neighboring memory cells.

In the case in which the correction voltage has been supplied to the unselected bit lines, it does not have an effect on the program operation because the level of the correction voltage supplied to the unselected bit lines is not changed (that is, the level of the correction voltage maintains a high level). On the other hand, in the case in which the correction voltage has been supplied to the selected bit line, the level of the correction voltage maintains a low level. Next, if the correction voltage of a high level is supplied to the selected bit line, the level of the correction voltage shifts to a high level. If the level of the correction voltage supplied to the bit line rises to a high level as described above, a difference in the voltage between a channel and the control gate of the memory cell Sel. Cell coupled to the selected bit line is reduced. Accordingly, the program operation on the selected memory cell is stopped. In other words, the injection of electrons into the floating gate is reduced.

In some embodiments of the present invention, the control circuits CT1 to CTk of the control unit 400 (refer to FIG. 6) may be grouped into two or more circuits and configured to output the correction voltages CO1 to CTk on a group basis.

For example, the control circuits CT1 to CTk can be classified into three control groups GR[A], GR[B], and GR[C] in order of the distance from the row decoder 200 (refer to FIG. 6). The control groups GR[A], GR[B], and GR[C] can simultaneously output the correction voltages on a group basis.

In more detail, when the program voltage Vpgm is supplied to the selected word line Sel. WL via the row decoder 200

(refer to FIG. 6), the program voltage Vpgm is supplied to the selected memory cells Sel. Cell with a set delay time in order of the control groups GR[A], GR[B], and GR[C] which are sequentially closer to the row decoder 200 (refer to FIG. 6). Next, after the program voltage Vpgm has been supplied to the selected memory cells Sel. Cell included in the region A, the correction voltage is supplied to all of the bit lines of the region A. Accordingly, a difference in the voltage between the channel region of the memory cells and the word line Sel. WL coupled to the selected memory cells Sel. Cell included in the region A is decreased, and so the program operation is stopped.

Regarding the time period needed to supply the memory cells with the program voltage Vpgm, the time period C (refer to FIG. 7) needed to supply the program voltage Vpgm to the memory cells which are the farthest to the row decoder 200 (refer to FIG. 6) preferably is a reference time. Furthermore, the time interval between the correction voltages outputted by the neighboring control circuits CT1 to CTk (refer to FIG. 6) is identical with the time interval needed to supply the program voltage Vpgm to each of the memory cells. For example, the time period needed to transfer the program voltage Vpgm between the neighboring memory cells can be set using the following method. If, when a test operation is performed on a semiconductor device, a time difference T1 between the time period needed to supply the program voltage Vpgm to memory cells which are the closest to the row decoder 200 (refer to FIG. 6) and the time period needed to supply the program voltage Vpgm to memory cells which are the farthest away from the row decoder 200 (refer to FIG. 6) is measured and then divided by the number of memory cells K (where K is a natural number) included in a page (memory cells coupled to the same word line), the delay time of the program voltage between the neighboring memory cells can be measured.

In some embodiments of the present invention, in the case in which the control circuits CT1 to CTk (refer to FIG. 6) are grouped into the control groups GR[A], GR[B], and GR[C], the correction voltages can be sequentially supplied to the control groups GR[A], GR[B], and GR[C] on a group basis with a time difference comparable to a reference time. The reference time period can be obtained by measuring the time period needed to supply the program voltage Vpgm to each control group and dividing a result of the measurement by the number of control groups. In more detail, after a passage of a set time period since the program voltage Vpgm was supplied to the region A which is the closest to the row decoder 300, the correction voltage is supplied to bit lines included in the region A. The set time period corresponds to the time period needed to substantially program memory cells which are the farthest away from the row decoder 200 (refer to FIG. 6). The correction voltage CO1 is preferably supplied at a high level (preferably, a power source voltage). When the correction voltage is supplied to the region A, the level of voltage supplied to the channel of selected memory cells of the region A is raised. In other words, since a difference in the voltage between the channel and a word line coupled to the selected memory cells include in the region A is decreased, the program operation is stopped.

After a passage of a set time period since the program voltage Vpgm was supplied to the memory cells included in the region B, the control group GR[B] corresponding to the region B outputs the correction voltages, and so the program operation is stopped. Accordingly, the program operation is performed on the memory cells included in the region A and the region B during a set time period.

Regarding the memory cells included in the region C, the time period needed to supply the program voltage Vpgm to the memory cells included in the region C has been set as the reference time period. Accordingly, the correction voltages are not supplied to the memory cells included in the region C during the time period that the program voltage Vpgm is being supplied to the memory cells included in the region C.

Accordingly, the program operation are performed on all of the memory cells included in the regions A to C during a set time.

In embodiments of the present invention, the correction voltages can be supplied to only bit lines coupled to selected memory cells to be programmed. For example, the control unit 400 (refer to FIG. 6) can select control circuits based on the addresses of memory cells to be programmed. When the program voltage Vpgm is supplied to word lines coupled to the corresponding memory cells, each of the control circuits outputs the correction voltage according to the time that it takes to supply the program voltage Vpgm to each of the corresponding memory cells.

In the program completion period T4, a program verification operation is performed.

Figure 8:
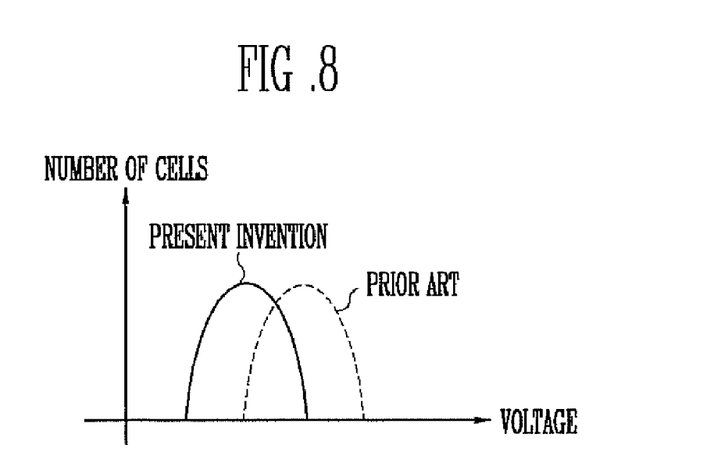
FIG. 8 is a graph showing a distribution of threshold voltages according to a further embodiment of the present invention.

FIG. 8 is a graph showing a distribution of threshold voltages according to an embodiment of the present invention.

As described above, the time period needed to supply the program voltage Vpgm to each memory cell is equalized irrespective of the distance from the row decoder. Accordingly, selected memory cells are programmed to have a uniform threshold voltage. In particular, since the interval between the sections of the threshold voltages are secured in an MLC, the reliability of a nonvolatile memory device is improved.

According to embodiments of the present invention, when a program operation is performed, the level of voltage supplied to a bit line is controlled according to the distance between the row decoder and a string. Thus, the time period needed to supply selected memory cells with a program voltage becomes equalized. Accordingly, a distribution of the threshold voltages of memory cells to be programmed becomes equalized, or the width of a distribution of the threshold voltages is narrowed. Consequently, the reliability of a program operation on a nonvolatile memory device is improved.

What is claimed is:

1. A nonvolatile memory device, comprising:
a memory cell array including a number of memory cells;
a row decoder coupled to the memory cells through word lines;
page buffers coupled to the memory cells through bit lines; and
a control unit configured to sequentially supply correction voltages to the bit lines in order of the bit lines' closeness to the row decoder to reduce a voltage difference between a channel and a control gate of the memory cells coupled to selected bit lines.

2. The nonvolatile memory device of claim 1, wherein the control unit comprises:
a number of correction voltage generators configured to generate the respective correction voltages, and a number of data control units configured to input data to the page buffers.

3. The nonvolatile memory device of claim 2, wherein each of the correction voltage generators is configured to output the correction voltage to the selected bit line after a program voltage for the program operation has been supplied to the selected word line.

4. The nonvolatile memory device of claim 2, wherein:
a corresponding correction voltage generator outputs an operation signal to a corresponding data control unit in response to a level of the correction voltage shifting from a high level to a low level, and the corresponding data control unit outputs first and second input signals to store the data in a corresponding page buffer in response to the operation signal.

5. The nonvolatile memory device of claim 4, wherein the data control unit outputs the first and second input signals to the page buffer and also outputs the first and second input signals to the corresponding page buffer in response to the program operation being performed and the operation signal output by the corresponding correction voltage generator.

6. The nonvolatile memory device of claim 1, wherein each of the correction voltages is either output to either a node between a sense node and a bit line selection unit of each of the page buffers, or is supplied to a corresponding bit line.

7. The nonvolatile memory device of claim 2, wherein the correction voltage generators and the data control units are classified into groups.

8. A method of programming a nonvolatile memory device, the method comprising:
selecting a memory block having memory cells;
supplying a pass voltage to word lines coupled to the memory cells;
supplying a program voltage to a selected word line coupled to selected ones of the memory cells; and
sequentially supplying correction voltages to all bit lines, in order of the bit lines' closeness to the row decoder to reduce a voltage difference between a channel and a control gate of the memory cells coupled to selected bit lines.

9. The method of claim 8, wherein a level of the correction voltages supplied to the bit lines is a high level.

10. The method of claim 8, wherein the correction voltage is supplied to the selected word line after the program voltage for a program operation has been supplied to the selected word line.

11. The method of claim 8, further comprising classifying the bit lines into groups and sequentially supplying the correction voltages to the groups in order of the groups closeness to the row decoder.

12. The method of claim 8, wherein a difference between time periods for the correction voltages to be supplied to the respective bit lines corresponds to a time period to supply the program voltage to the memory cells.

13. The method of claim 12, wherein the time period to supply the program voltage to the memory cells is determined by measuring a difference between a time period to supply the program voltage to the memory cells closest to the row decoder and a time period to supply the program voltage to the memory cells farthest to the row decoder and dividing the measured difference by a number of memory cells included in a page.

14. A method of programming a nonvolatile memory device, the method comprising:
selecting a memory block including memory cells;
supplying a pass voltage to word lines coupled to the memory cells;
supplying a program voltage to a selected word line from among the word lines coupled to selected ones of the memory cells; and
sequentially supplying correction voltages to only bit lines coupled to the selected memory cells, in order of the bit lines' closeness to the row decoder to reduce a voltage difference between a channel and a control gate of the memory cells coupled to selected bit lines.

15. The method of claim 14, wherein a level of the correction voltages supplied to the bit lines is a high level.

16. The method of claim 14, wherein the correction voltage is supplied to the selected word line after the program voltage for a program operation has been supplied to the selected word line.

17. The method of claim 14, further comprising classifying the bit lines into groups and sequentially supplying the correction voltages to the groups in order of the groups' closeness to the row decoder.

18. The method of claim 14, wherein a difference between time periods for the correction voltages to be supplied to the respective bit lines corresponds to a time period to supply the program voltage to the memory cells.

19. The method of claim 18, wherein the time period to supply the program voltage to the memory cells is determined by measuring a difference between a time period to supply the program voltage to the memory cells closest to the row decoder and a time period to supply the program voltage to the memory cells farthest from the row decoder and dividing the measured difference by a number of memory cells included in a page.

* * * * *